United States Patent
Kawasaki et al.

(10) Patent No.: US 8,013,327 B2
(45) Date of Patent: Sep. 6, 2011

(54) ELECTRONIC DEVICE

(75) Inventors: Masahiro Kawasaki, Cambridge (GB); Masaaki Fujimori, Kodaira (JP); Takeo Shiba, Kodaira (JP); Shuji Imazeki, Hitachi (JP); Tadashi Arai, Kumagaya (JP)

(73) Assignee: Hitachi, Ltd., Tokyo (JP)

( * ) Notice: Subject to any disclaimer, the term of this patent is extended or adjusted under 35 U.S.C. 154(b) by 188 days.

(21) Appl. No.: 12/385,937

(22) Filed: Apr. 24, 2009

(65) Prior Publication Data
US 2009/0294852 A1 Dec. 3, 2009

(30) Foreign Application Priority Data

Jun. 3, 2008 (JP) .................. 2008-145753

(51) Int. Cl.
*H01L 29/08* (2006.01)
*H01L 35/24* (2006.01)
*H01L 51/00* (2006.01)
*H01L 27/12* (2006.01)
*H01L 29/66* (2006.01)

(52) U.S. Cl. .............. 257/40; 257/57; 257/59; 257/347; 257/352; 257/353; 257/354; 257/E29.117; 257/E29.137; 257/E29.151; 257/E29.29; 438/38

(58) Field of Classification Search ................ 257/347, 257/E29.286, 57, 59, 352–354, E29.29, E29.151, 257/E29.117, E29.137; 438/38
See application file for complete search history.

(56) References Cited

U.S. PATENT DOCUMENTS

| | | | |
|---|---|---|---|
| 6,905,906 B2 * | 6/2005 | Sirringhaus et al. | 438/99 |
| 2004/0232495 A1 | 11/2004 | Saito et al. | |
| 2005/0003166 A1 * | 1/2005 | Hirai | 428/195.1 |
| 2005/0029591 A1 * | 2/2005 | Yudasaka et al. | 257/347 |
| 2005/0052120 A1 * | 3/2005 | Gupta et al. | 313/503 |
| 2006/0148167 A1 | 7/2006 | Brown et al. | |
| 2006/0160276 A1 | 7/2006 | Brown et al. | |
| 2006/0160277 A1 * | 7/2006 | Sirringhaus et al. | 438/149 |
| 2007/0023837 A1 * | 2/2007 | Lee et al. | 257/347 |
| 2008/0241990 A1 * | 10/2008 | Kim et al. | 438/99 |
| 2008/0246089 A1 * | 10/2008 | Ko et al. | 257/347 |
| 2009/0026445 A1 * | 1/2009 | Noh et al. | 257/40 |
| 2010/0102300 A1 * | 4/2010 | Burroughes et al. | 257/40 |
| 2010/0314614 A1 * | 12/2010 | Bale et al. | 257/40 |

FOREIGN PATENT DOCUMENTS

| JP | 2004-241397 | 1/2003 |
|---|---|---|
| JP | 2006-510210 | 12/2003 |

* cited by examiner

*Primary Examiner* — Zandra Smith
*Assistant Examiner* — Jeremy J Joy
(74) *Attorney, Agent, or Firm* — Stites & Harbison PLLC; Juan Carlos A. Marquez, Esq.

(57) ABSTRACT

A thin-film transistor includes an insulating substrate, a source electrode, and a drain electrode, disposed over the top of the insulating substrate, a semiconductor layer electrically continuous with the source electrode, and the drain electrode, respectively, a gate dielectric film formed over the top of at least the semiconductor layer; and a gate electrode disposed over the top of the gate dielectric film so as to overlap the semiconductor layer. Further, a first bank insulator is formed so as to overlie the source electrode, a second bank insulator is formed so as to overlie the drain electrode, and the semiconductor layer, the gate dielectric film, and the gate electrode are embedded in a region between the first bank insulator, and the second bank insulator.

4 Claims, 6 Drawing Sheets

ELECTRONIC DEVICE

CLAIM OF PRIORITY

The present application claims priority from Japanese patent application JP 2008-145753 filed on Jun. 3, 2008, the content of which is hereby incorporated by reference into this application.

FIELD OF THE INVENTION

The invention relates to an electronic device, and in particular, to a thin-film transistor formed by use of coating techniques, or printing techniques, and a device using the same.

BACKGROUND OF THE INVENTION

As further advances are made in computerization, attention has been focused on the development of devices such as an e-paper display that is small in thickness and light in weight, so as to be capable of substituting for paper, an IC-tag capable of instantaneously identifying merchandise one by one, and so forth. As a switching element in those devices, use is currently made of a thin-film transistor wherein amorphous silicon (a-Si) or polycrystalline silicon (p-Si) is used for semiconductor. However, manufacturing of the thin-film transistor using those silicon-based semiconductors will not only cause an increase in manufacturing cost because of the necessity of installing an expensive plasma enhanced chemical vapor deposition (CVD) system, sputtering system, and so forth, but also cause the inconvenience of lowering throughput because of the necessity of going through respective processes of vacuum process, photolithography, additional working, and so forth.

Accordingly, attention has since been focused on the development of an organic thin-film transistor, and an oxide thin-film transistor, with an organic matter and a metal oxide, used in a semiconductor layer, respectively, since those thin-film transistors can be formed by use of a coating method, or a printing method, thereby enabling products thereof to be provided inexpensively.

In order to enhance a working speed of the thin-film transistor described as above, and a working speed of a circuit wherein the plural thin-film transistors are connected with each other to be assembled, it is necessary not only to enhance field effect mobility of the thin-film transistor but also to lessen parasitic capacitance occurring to overlapping parts between a gate electrode and source•drain electrodes.

There has been known a technology (refer to JP-A-2004-241397 given hereunder) whereby source•drain electrodes are formed at respective protrusions formed on a substrate, by means of photolithography, respectively, a channel and a gate are formed in a recessed region between the protrusions, and the source•drain electrodes and a gate electrode are formed in a self-aligned fashion, thereby forming a thin-film transistor that has successfully lessened parasitic capacitance occurring to overlapping parts between the gate electrode and the source-drain electrodes.

Further, there has also been known a technology (refer to JP-T-2006-510210 given hereunder) whereby source•drain electrodes and a gate electrode are formed in a self-aligned fashion by means of a printing method utilizing embossing, thereby forming a thin-film transistor that has successfully lessened parasitic capacitance occurring to overlapping parts between the source•drain electrodes, and the gate electrode.

SUMMARY OF THE INVENTION

The technology disclosed in JP-A-2004-241397, however, has a problem in that, in the case of using a plastic substrate, the substrate repeats irreversible expansion and contraction owing to thermal hysteresis at the time of forming respective constituent members, so that misalignment occurs among the respective constituent members. Further, even in the case of using a glass substrate smaller in thermal expansion coefficient as compared with the plastic substrate, misalignment ranging from several μm to several tens of μm occurs among the respective constituent members due to factors traceable to a device when a semiconductor layer, a gate dielectric film, and a gate electrode are formed by printing. It is known that the misalignment in this case occurs while material jetted out of a head is in flight before adhesion to the substrate in the case of, for example, using an ink-jet method whereas the misalignment occurs upon a material pattern being transferred from a transfer roll to the substrate in the case of using a transfer printing method.

In the case of a configuration wherein source•drain electrodes are formed at respective protrusions on the substrate, if the respective members such as the gate dielectric film, the semiconductor layer, and the gate electrode are deposited by sequential printing, the source•drain electrodes come to be in contact with the gate electrode, thereby causing the inconvenience of the transistor failing to function.

Further, the technology disclosed in JP-T-2006-510210 has not solved a problem of misalignment in position between the semiconductor layer, and the gate dielectric film as yet. As printed films are further deposited, embossed parts will decrease in width, so that overlapping parts will occur between the source•drain electrodes, and the gate electrode, thereby raising a possibility of parasitic capacitance occurring to the overlapping parts.

It is therefore an object of the invention to provide a thin-film transistor capable of checking misalignment in position among constituent members thereof, further intended for reduction in parasitic capacitance, and to provide a device using the same.

The above and other objects, features and advantages of the present invention will be apparent from the following detailed description of the preferred embodiments of the invention, read in conjunction with the accompanying drawings.

Representative embodiments of the invention, disclosed under the present application, will be briefly described as follows:

(1) A thin-film transistor according to the invention is, for example, a thin-film transistor which includes an insulating substrate, a source electrode, a drain electrode, disposed over the top of the insulating substrate, a semiconductor layer electrically continuous with the source electrode, and the drain electrode, respectively, a gate dielectric film formed over the top of at least the semiconductor layer; and a gate electrode disposed over the top of the gate dielectric film so as to overlap the semiconductor layer, in which a first bank insulator is formed so as to overlie the source electrode, a second bank insulator is formed so as to overlie the drain electrode, and the semiconductor layer, the gate dielectric film, and the gate electrode being embedded in a region between the first bank insulator, and the second bank insulator.

(2) The thin-film transistor according to the invention may be, for example, a thin-film transistor based on a configuration under (1) as above, in which the first bank insulator is formed such that sidewall faces thereof have inverse taper shapes against the insulating substrate, and the semiconductor layer is formed such that respective sidewall faces thereof are butted against a sidewall face of the source electrode, and a sidewall face of the drain electrode, while overlying the source electrode, and the drain electrode.

(3) The thin-film transistor according to the invention may be, for example, a thin-film transistor based on a configuration under (1) as above, in which the semiconductor layer, the gate dielectric film, and the gate electrode are formed by a coating method.

(4) The thin-film transistor according to the invention may be, for example, a thin-film transistor based on a configuration under (1) as above, in which the bank insulator each have lipophobic.

(5) The thin-film transistor according to the invention may be, for example, a thin-film transistor based on a configuration under (1) as above, in which the gate electrode is formed such that the surface thereof is lower than the surface of each the bank insulators over the insulating substrate.

(6) A thin-film transistor substrate according to the invention is, for example, a thin-film transistor substrate which includes plural thin-film transistors disposed in matrix fashion over the insulating substrate, the thin-film transistors each including a source electrode, a drain electrode, a semiconductor layer electrically continuous with the source electrode, and the drain electrode, respectively, a gate dielectric film formed over the top of at least the semiconductor layer, and a gate electrode disposed over the top of the gate dielectric film so as to overlap the semiconductor layer, in which a first bank insulator is formed so as to overlie the source electrode, a second bank insulator is formed so as to overlie the drain electrode, and in which the semiconductor layer, the gate dielectric film, and the gate electrode are embedded in a region between the first bank insulator, and the second bank insulator.

(7) The thin-film transistor substrate according to the invention may be, for example, a thin-film transistor substrate based on a configuration under (6) as above, in which the first bank insulator is formed such that sidewall faces thereof have inverse taper shapes against the insulating substrate, and the semiconductor layer is formed such that respective sidewall faces thereof are butted against a sidewall face of the source electrode, and a sidewall face of the drain electrode, while overlying the source electrode, and the drain electrode.

(8) The thin-film transistor substrate according to the invention may be, for example, a thin-film transistor substrate based on a configuration under (6) as above, in which the semiconductor layer, the gate dielectric film, and the gate electrode are formed by a coating method.

(9) The thin-film transistor substrate according to the invention may be, for example, a thin-film transistor substrate based on a configuration under (6) or (7) as above, in which the bank insulators each have lipophobic.

(10) The thin-film transistor substrate according to the invention may be, for example, a thin-film transistor substrate based on a configuration under (6) or (7) as above, in which the gate electrode is formed such that the surface thereof is lower than the surface of each the bank insulators over the insulating substrate.

(11) A display device according to the invention is, for example, a display device which includes plural thin-film transistors disposed in matrix fashion over the insulating substrate, the thin-film transistors each including a source electrode, a drain electrode, a semiconductor layer electrically continuous with the source electrode, and the drain electrode, respectively, a gate dielectric film formed over the top of at least the semiconductor layer, and a gate electrode disposed over the top of the gate dielectric film so as to overlap the semiconductor layer, in which a first bank insulator is formed so as to overlie the source electrode, and a second bank insulator is formed so as to overlie the drain electrode, and in which the semiconductor layer, the gate dielectric film, and the gate electrode are embedded in a region between the first bank insulator, and the second bank insulator.

(12) The display device according to the invention may be, for example, a display device based on a configuration under (11) as above, in which the first bank insulator is formed such that sidewall faces thereof have inverse taper shapes against the insulating substrate, and the semiconductor layer is formed such that respective sidewall faces thereof are butted against a sidewall face of the source electrode, and a sidewall face of the drain electrode, while overlying the source electrode, and the drain electrode.

(13) The display device according to the invention may be, for example, a display device based on a configuration under (11) as above, in which the semiconductor layer, the gate dielectric film, and the gate electrode are formed by a coating method.

(14) The display device according to the invention may be, for example, a display device based on a configuration under (11) as above, in which the bank insulators each have lipophobic.

(15) The display device according to the invention may be, for example, a display device based on a configuration under (11) as above, in which the gate electrode is formed such that the surface thereof is lower than the surface of each the bank insulators over the insulating substrate.

(16) An IC-tag device according to the invention is an IC-tag device in which the thin-film transistor substrate based on a configuration under (6) as above is incorporated.

(17) A sensor device according to the invention is a sensor device in which the thin-film transistor based on a configuration under (1) as above is incorporated.

Further, it is to be understood that configurations described in the foregoing are to be taken as preferred embodiments, respectively, and that various changes and modifications may be made in the invention without departing from the spirit and scope thereof. Examples of the configurations of the invention, other than those configurations described in the foregoing, will be apparent from the full description of the present specification, read in conjunction with the accompanying drawings.

With the thin-film transistor of the configuration described as above, and the device using the same, it is possible to check misalignment in position among the constituent members of the thin-film transistor, and to achieve reduction in parasitic capacitance. Other advantageous effects of the invention will become apparent from the description of the present specification as a whole.

DETAILED DESCRIPTION OF THE PREFERRED EMBODIMENTS

Embodiments of the invention are described hereinafter with reference to the accompanying drawings.

First Embodiment

Figure 1:
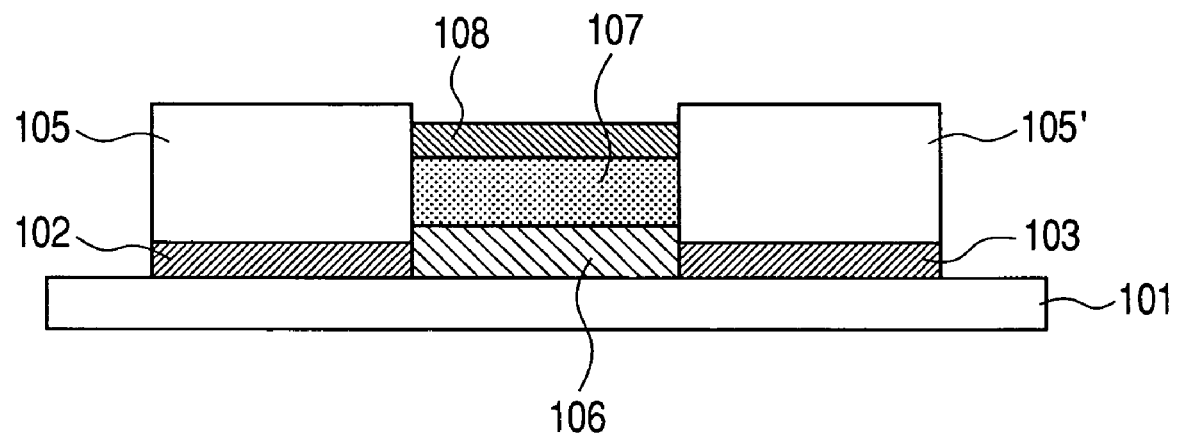
FIG. 1 is a sectional view showing the configuration of a first embodiment of a thin-film transistor according to the invention.

FIG. 1 is a sectional view showing the configuration of a first embodiment of a thin-film transistor according to the invention.

In FIG. 1, there is provided a transparent substrate 101, and a source electrode 102, and a drain electrode 103 are disposed over the surface of the transparent substrate 101 in such a way as to be parted from each other. Further, a bank insulator 105 formed substantially in the same pattern as that for the source electrode 102 is disposed so as to overlie the top of the source electrode 102. Similarly, a bank insulator 105' formed substantially in the same pattern as that for the drain electrode 103 is disposed so as to overlie the top of the drain electrode 103.

A semiconductor layer 106 is formed in a portion of the surface of the transparent substrate 101, between the bank insulator 105 and the bank insulator 105'. The semiconductor layer 106 is formed so as to be slightly larger in film thickness than, for example, the source electrode 102 in an underlying layer of the bank insulator 105, and the drain electrode 103 in an underlying layer of the bank insulator 105' such that the semiconductor layer 106 is electrically continuous with the source electrode 102, and the drain electrode 103, respectively.

Further, a gate dielectric film 107 is formed over the top of the semiconductor layer 106, between the bank insulator 105, and the bank insulator 105', and further, a gate electrode 108 is formed over the top of the gate dielectric film 107. In this case, the gate electrode 108 is formed such that the surface thereof is lower than the respective surfaces of the bank insulator 105, and the bank insulator 105', thereby preventing the gate electrode 108 from overlying the bank insulator 105, and the bank insulator 105', respectively. In so doing, the gate electrode 108 can be formed so as not to overlap the source electrode 102, and the drain electrode 103, respectively, as seen in a plan view, thereby establishing a configuration in which occurrence of parasitic capacitance among those constituent elements can be avoided.

FIGS. 2A to 2E each shows respective steps of a process for manufacturing the thin-film transistor shown in FIG. 1. In FIGS. 2A to 2E, shown on the left-hand side in each the figures is a sectional view while shown on the right-hand side is a plan view. The sectional views each show a section of the thin-film transistor, taken on line A-A of the plan view of FIG. 2A. The process is described hereinafter in the order of process steps.

Figure 2A:
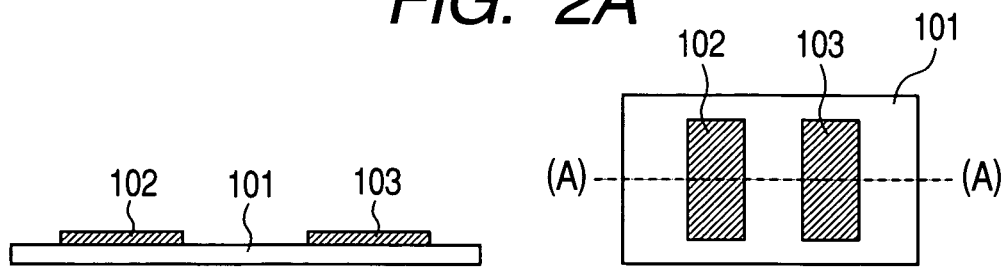
FIG. 2A, FIG. 2B, FIG. 2C, FIG. 2D, and FIG. 2E each show respective steps of a process for manufacturing the thin-film transistor according to the first embodiment.

First, the transparent substrate 101 is prepared as shown in FIG. 2A. For the transparent substrate 101, use is made of a polycarbonate substrate, for example, 100 µm thick. Material for the transparent substrate 101 can be selected among transparent and insulating materials in a wide-ranging scope, other than polycarbonate. More specifically, use can be made of inorganic substrates made of quartz, sapphire, and so forth, respectively, and organic plastic substrates made of acrylic, epoxy, polyamide, polycarbonate, polyimide, polynorbornene, poly(phenylene oxide), polyethylene naphthalenedicarboxylate, polyethylene terephthalate, polyethylene naphthalate, polyallylate, poly(etherketone), poly(ethersulfone), polyketone, poly(phenylene sulfide), and so forth, respectively. Furthermore, use may be made of one of those substrates, with a film such as a silicon oxide film, a silicon nitride film, and so forth, provided on the surface thereof.

Then, the source electrode 102, and the drain electrode 103, 300 nm in thickness, respectively, are drawn on the top of the transparent substrate 101 by, for example, an inverse printing method with the use of nano ink of Au to be thereby fired at 150° C. There is no particular limitation to material for use in the source electrode 102, and the drain electrode 103, respectively, as long as the material is an electric conductor, and both the source electrode 102 and the drain electrode 103 may be drawn with the use of nano ink of any of, for example, Ag, Cu, Pt, Pb, and so forth, or an organic electric conductor such as polyaniline, and poly 3,4-ethylene dioxythiophene/polystyrene sulfonate. Techniques for use in drawing the source electrode 102 and the drain electrode 103 include a screen printing method, an ink-jet method, a hot stamping method, a micro-printing method, and so forth besides the inverse printing method. Furthermore, the source electrode 102 and the drain electrode 103 can be formed by the known method such as a plasma enhanced CVD) method, thermal vapor deposition method, sputtering method, an electrolytic polymerization method, electroless plating method, electroplating method, and so forth with the use of a metal selected from the group consisting of Al, Cu, Ti, Cr, Au, Ag, Ni, Pd, Pt, and Ta. The source electrode 102 and the drain electrode 103 can be used not only in the form of a single-layer structure but also in the form of a structure where plural layers are stacked. Further, the source electrode 102 and the drain electrode 103 can be worked into a desired shape by use of photolithography, a shadow mask method, a laser ablation method, and so forth.

Next, the transparent substrate 101 is immersed in a solution of 0.1 mM octadecanthiol for 1 minute to be subsequently rinsed in chloroform, thereby forming a self-assembled monolayer (not shown) over the source electrode 102 and the drain electrode 103, respectively. For the source electrode 102 and the drain electrode 103, use may be made of a metal that is susceptible of covalent bond with a sulfur atom, and is selected from the group consisting of silver, copper, platinum, palladium, tin, and so forth, or an alloy containing such a metal or mixture of those metals. For the self-assembled monolayer, use can be made of decanethiol other than octadecanethiol, alkanethiol such as, octanethiol, pentanethiol, and so forth, nitrothiol, fluorothiol, aminothiol, and any substance having thiol radical (—SH), such as thiolphenol short in molecular length, nitro thiolphenol, fluorothiophenol, aminothiolphenol, and so forth. Herein, the role of the self-assembled monolayer is to enhance efficiency of carrier injection from the source electrode 102 into the semiconductor layer as described later on to thereby improve the field effect mobility of the thin-film transistor. Since the thin-film transistor operates even if the self-assembled monolayer is not formed, there can be a case where the self-assembled monolayer is not formed.

Figure 2B:
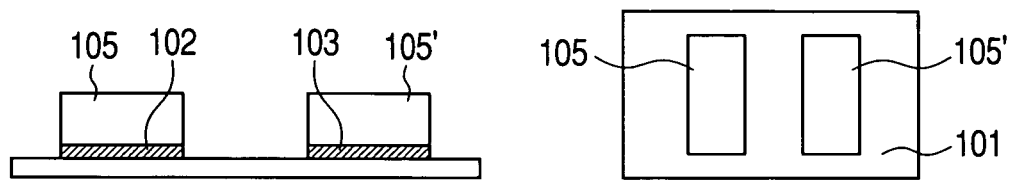

Subsequently, a polyimide film having positive photosensitivity is spin-coated to a thickness of 1.5 µm, on the transparent substrate 101, shown in FIG. 2B, to be subsequently subjected to exposure from the back surface of the substrate, by making use of the source electrode 102 and the drain electrode 103, as a photomask, respectively, and after development, the bank insulator 105 and the bank insulator 105', substantially matching up in a plan view pattern shape with the source electrode 102 and the drain electrode 103, respectively, are formed over the source electrode 102 and the drain electrode 103, respectively. Thereafter, the respective surfaces of the bank insulator 105 and the bank insulator 105' are exposed to fluorine plasma treatment, thereby causing the respective surfaces to undergo change in property so as to have lipophobic.

The material of each the bank insulator 105, 105' is not limited to polyimide, and for each the bank insulator 105, 105', use can be made of a photosensitive insulator in a wide-ranging scope. Furthermore, if fluorine is added to the material of each the bank insulator 105, 105' beforehand, this will enable the fluorine plasma treatment to be omitted. Further, in the case where polyvinyl phenol and silicon oxide are used for the bank insulator 105, it is also possible to cause the surface of the bank insulator 105 to undergo change in property so as to have lipophobic by cover the top of the bank insulator 105 with a monomolecular film of octadecyl trichlorosilane.

For the monomolecular film, use may be made of a silane compound such as heptaphloroisoprooxy propylmethyl dichlorosilane, triphloro propylmethyl dichlorosilane, hexamethyldisilazane, triethoxyvinylsilane, γ-methacryloxypropyl trimethoxysilane, γ-aminopropyl triethoxylsilane, N-phenyl-γ-aminopropyl trimethoxysilane, γ-mercaptopropyl trimethoxysilane, heptadecanephloro-1,1,2,2-tetrahydrodecyl-1-trimethoxysilane, octadecyl triethoxysilane, decyltrichlorosilane, decyl trimethoxysilane, phenyl trichlorosilane, and so forth, and a phosphoric acid compound and so forth, such as 1-phosphonooctane, 1-phosphonohexane, 1-phosphonohexadecane, 1-phosphono-3,7,11,15-tetramethylhexadecane, 1-phosphono-2-ethylhexane, 1-phosphono-2,4,4-trimethylpentane, 1-phosphono-3-5, and 5-trimethylhexane. The modification of the bank insulator 105 can be implemented by bringing the surface thereof into contact with solution or vapor of any of those compounds to thereby cause the compound to adsorb to the surface of the gate dielectric film. Further, it is also possible to form the bank insulator 105, and the bank insulator 105' in such a way as to have inverse taper shapes against the substrate 101 (refer to FIG. 3), respectively, through over-exposure, or to cause the bank insulator 105, and the bank insulator 105' to become smaller (refer to FIG. 4) in plan view pattern than the source electrode 102, and the drain electrode 103, respectively.

Figure 2C:
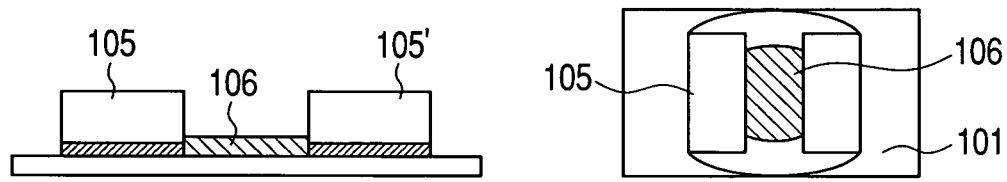

Next, the semiconductor layer 106 is formed in an interval between a pair of the bank insulators 105, 105' by use of a coating method, as shown in FIG. 2C. More specifically, the semiconductor layer 106 350 nm thick is formed by coating the transparent substrate 101 with a solution of a pentacene derivative by use of ink-jet printing to be fired at 100° C. For the semiconductor layer 106, use can be made of an organic semiconductor material besides the pentacene derivative, including phthalocyanine compound such as copper phthalocyanine, lutetium bisphthalocyanine, and aluminum phthalocyaninechloride, condensation polycyclic aromatic compound such as tetracene, chrysene, pentacene, pyrene, perylene, and coronene, and a conjugated system polymer such as polyaniline, polytienylene vinylene, poly (3-hexylthiophene), poly(3-butylthiophene), poly (3-decylthiophene), poly(9,9-dioctylfluorene), poly(9,9-dioctylfluorene-co-benzothiadiazole), and poly(9,9-dioctylfluorene-co-dithiophene), or an oxide semiconductor material that can be dissolved in a solution. Further, as the coating method, use can be made of a spray method and spin-coating method, besides the ink-jet method.

Figure 2D:
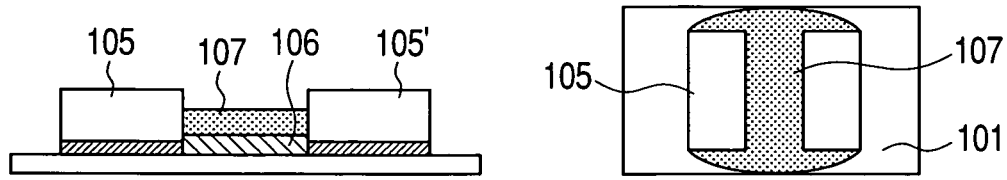

Subsequently, the gate dielectric film 107 500 nm thick is formed by applying a solution of polyvinyl phenol by the ink-jet method in such a way as to cover the semiconductor layer 106, as shown in FIG. 2D, to be fired at 100° C. For the gate dielectric film 107, use can be made of organic films other than a polyvinyl phenol film, composed of polyvinyl alcohol, polyimide, polyamide, parylene, polymethyl methacrylate, poly (vinyl chloride), polyacrylonitrile, poly (perphloroethylene-co-butenylvinyl ether), polyisobutylene, poly(4-methyl-1-penthene), poly(propylene-co-(1-butene)), benzocyclobutene resin, and so forth, respectively, and an inorganic film composed of any of silicon oxide, silicon nitride, and so forth, or a stacked film made up of those films. Further, as the coating method, use can be made of the spray method, and the spin-coating method, besides the ink-jet method.

Figure 2E:
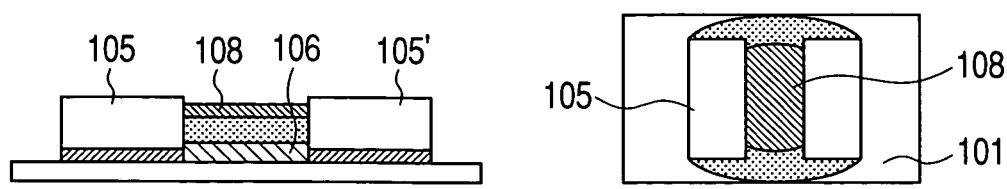

Next, the gate electrode 108 300 nm thick is drawn on the top of the gate dielectric film 107 by the ink-jet method with the use of nano ink of Ag to be thereby fired at 150° C., as shown in FIG. 2E. There is no particular limitation to material for the gate electrode 108 as long as it is an electric conductor, and the gate electrode 108 may be drawn with the use of nano ink of any of, for example, Au, Cu, Pt, Pb, and so forth, or an organic electric conductor such as polyaniline, and poly 3,4-ethylene dioxythiophene/polystyrene sulfonate. Techniques for use in drawing the gate electrode 108 can include a coating method such as the spray method and the spin-coating method, besides the ink-jet method.

Finally, polyimide (not shown) is spin-coated to a thickness of 300 nm so as to cover the entire surface of the substrate to be subsequently fired at 120° C., thereby forming a protective coat. For the protective coat, use can be made of an inorganic film composed of any of silicon oxide, silicon nitride, and so forth, without being limited to silicon oxide, and an organic film composed of any selected from the group consisting of polyvinyl phenol, polyvinyl alcohol, polyamide, parylene, polymethyl methacrylate, poly(vinyl chloride), polyacrylonitrile, poly(perphloroethylene-co-butenylvinyl ether), polyisobutylene, poly(4-methyl-1-penthene), poly (propylene-co-(1-butene)), benzocyclobutene resin, and so forth, or a stacked film made up of those films. And the protective coat can be formed by use of any of the plasma enhanced CVD) method, the thermal vapor deposition method, the sputtering method, an anodizing process, the spray method, the spin-coating method, a roll-coating method, a blade coating method, a doctor roll method, the screen printing method, the ink-jet method, and so forth.

Figure 3:
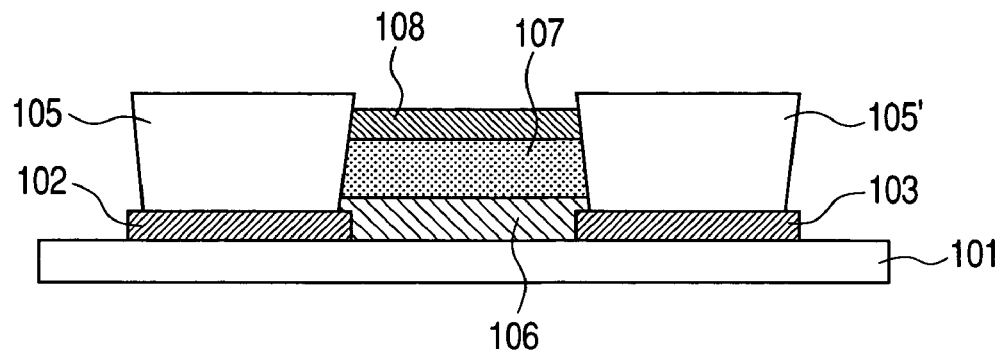
FIG. 3 is a sectional view showing the configuration of an example of a variation of the thin-film transistor shown in FIG. 1.

FIG. 3 is a view showing an example of a variation of the thin-film transistor shown in FIG. 1, and in the figure, a difference in configuration, as compared with the case of FIG. 1, lies in the bank insulator 105, and the bank insulator 105'. More specifically, the bank insulator 105, and the bank insulator 105' are each subjected to over-exposure upon the exposure from the back surface of the transparent substrate 101, thereby being formed in such a way as to have inverse taper shapes against the substrate 101, respectively, as shown FIG. 3. As a result, the periphery of the surface of the drain electrode 103 as well as the source electrode 102 comes to be exposed out of the bank insulator 105' as well as the bank insulator 105. In so doing, the semiconductor layer 106 is structured such that not only the semiconductor layer 106 is in contact with respective flanks of the source electrode 102, and the drain electrode 103, but also part of the semiconductor layer 106 is in contact with the respective tops of the source electrode 102, and the drain electrode 103. Accordingly, such a configuration has the effect of improving the efficiency of carrier injection from the source electrode 102, and the drain electrode 103, respectively, into the semiconductor layer 106. Furthermore, in this case as well, since the gate electrode 108 is formed in such a way as to be self-aligned with the source electrode 102, and the drain electrode 103, it is possible to significantly lessen parasitic capacitance occurring to overlapping parts where the gate electrode 108 overlaps the source electrode 102, and the drain electrode 103, respectively.

Figure 4:
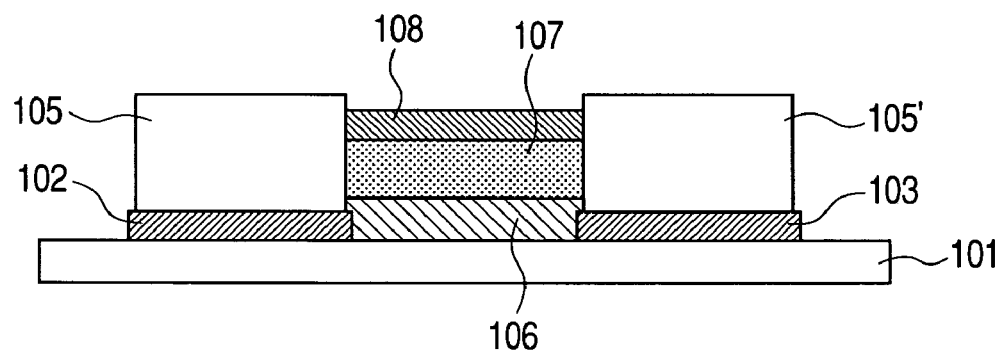
FIG. 4 is a sectional view showing the configuration of an example of another variation of the thin-film transistor shown in FIG. 1.

FIG. 4 is a view showing an example of another variation of the thin-film transistor shown in FIG. 1, and in the figure, a difference in configuration, as compared with the case of FIG. 1, lies in the bank insulator 105, and the bank insulator 105'. As shown in FIG. 4, the bank insulator 105, and the bank insulator 105' are rendered shrunken inward in plan view pattern from the source electrode 102, and the drain electrode 103, respectively, by subjecting the bank insulator 105, and the bank insulator 105' to over-exposure. Even in such a case, the semiconductor layer 106 will have parts thereof, in contact with not only the respective flanks of the source electrode 102, and the drain electrode 103, but also the respective tops of the source electrode 102, and the drain electrode 103, thereby exhibiting the effect of improving the efficiency of carrier injection from the source electrode 102, and the drain electrode 103, respectively, into the semiconductor layer 106. In this case, there are overlapping parts where the gate electrode 108 overlaps the source electrode 102, and the drain electrode 103, respectively, however, the overlapping parts can be controlled in width so as to fall within a range of 0.5 to 5 μm by optimization of over-development of the bank insulators 105, 105', thereby checking occurrence of parasitic capacitance to the minimum.

Second Embodiment

Figure 5:
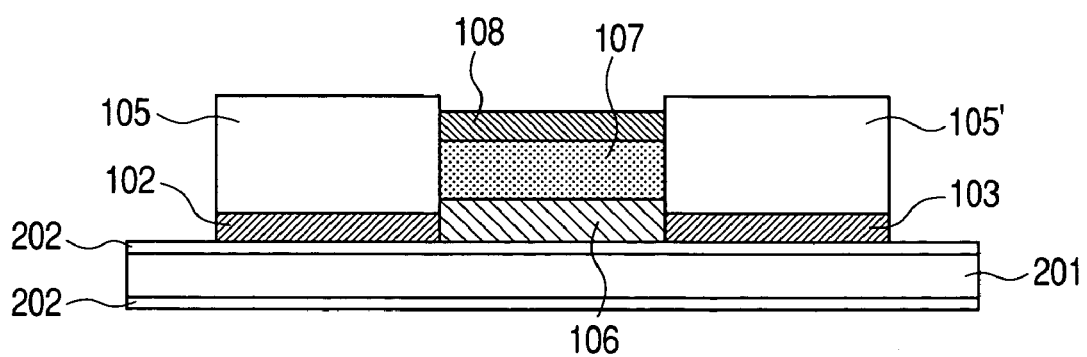
FIG. 5 is a sectional view showing the configuration of a second embodiment of a thin-film transistor according to the invention.

FIG. 5 is, a sectional view showing the configuration of a second embodiment of a thin-film transistor according to the invention, corresponding to FIG. 1.

In FIG. 5, a difference in configuration, as compared with the case of FIG. 1, lies first in an insulating substrate 201. The insulating substrate 201 is made up of, for example, a stainless steel substrate about 100 μm thick. For the insulating substrate 201, material other than stainless steel, in a wide-ranging scope, such as nickel, aluminum, copper, paper, and so forth, can be selected. Further, a barrier film 202 of insulating properties, having a function of improving resistance to chemicals, is formed on respective surfaces of the insulating substrate 201. In FIG. 5, the configuration of the thin-film transistor, in other respects, is the same as that shown in FIG. 1.

FIGS. 6A to 6F each show respective steps of a process for manufacturing the thin-film transistor shown in FIG. 5. In those figures, shown on the left-hand side is a sectional view while shown on the right-hand side is a plan view. The sectional views each show a section of the thin-film transistor, taken on line A-A of the plan view. The process is described hereinafter in the order of process steps.

Figure 6A:
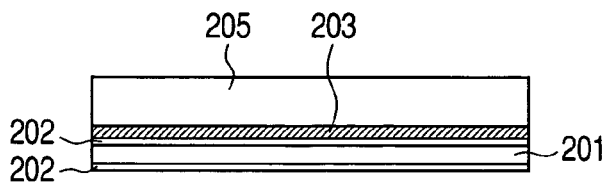
FIG. 6A, FIG. 6B, FIG. 6C, FIG. 6D, FIG. 6E, and FIG. 6F each show respective steps of a process for manufacturing the thin-film transistor according to the second embodiment.
Figure 6A:
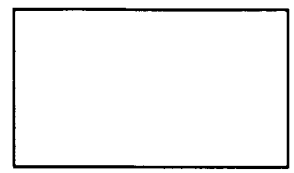

Step 1: FIG. 6A

First, an insulating substrate 201 made of, for example, stainless steel is prepared. A polysilazane film 1 μm thick, with a catalyst for low-temperature setting, added thereto, is formed on the respective surfaces of the insulating substrate 201, and the polysilazane film is fired at 150° C. to be reformed into a silicon oxide film, thereby forming the barrier film 202 with insulating properties. The barrier film 202 fulfills the role of improving the substrate's resistance to chemicals.

Next, nano ink of, for example, Ag is spin-coated on the barrier film 202 on one surface side of the insulating substrate 201 to be subsequently fired at 150° C., thereby forming an electrically conductive thin-film 203 300 nm thick. Further, for example, a polyimide film 205 1.5 μm thick is deposited on the top of the electrically conductive thin-film 203.

Figure 6B:
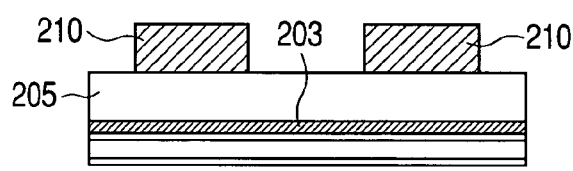
Figure 6B:
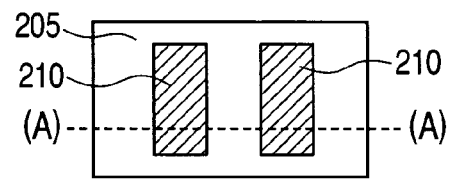

Step 2: FIG. 6B

A resist film is formed on the top of the polyimide film 205 to be patterned through exposure•development in such a way as to overlie regions where a source electrode 102, and a drain electrode 103, to be described later on, are to be respectively formed, thereby leaving a resist film 210 out.

Figure 6C:
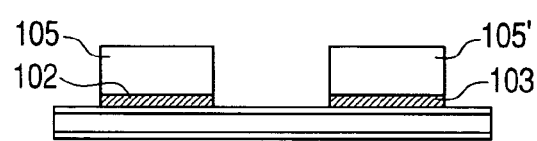
Figure 6C:
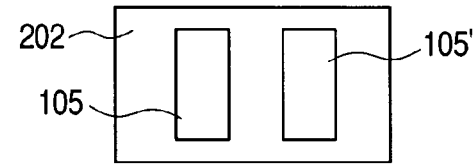
Figure 6D:
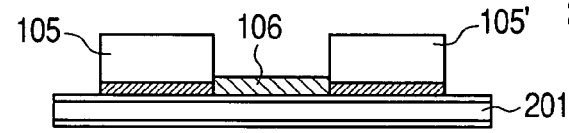
Figure 6D:
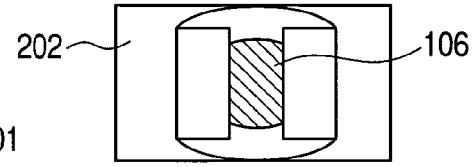
Figure 6E:
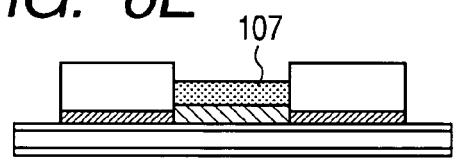
Figure 6E:
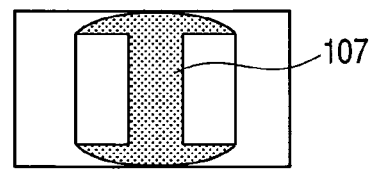
Figure 6F:
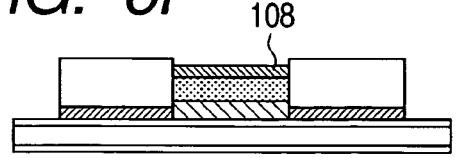
Figure 6F:
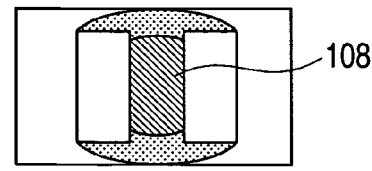

Step 3: FIG. 6C

The polyimide film 205 and the electrically conductive thin-film 203 are subjected to batch etching in that order by use of an acidic solution in oxygen plasma, using the resist film 210 as a mask. By so doing, there are formed the source electrode 102, together with a bank insulator 105 deposited over the source electrode 102, substantially matching up in plan view pattern therewith, and the drain electrode 103, together with a bank insulator 105' deposited over the drain electrode 103, substantially matching up in plan view pattern therewith.

Although not shown in FIG. 6C, the bank insulator 105, and the bank insulator 105' can be rendered shrunken inward in plan view pattern from the source electrode 102, and the drain electrode 103, respectively, as is the case with the first embodiment, by isotropic etching in oxygen plasma.

Then, after removal of the resist film 210, the respective surfaces of the bank insulator 105, and the bank insulator 105' are exposed to fluorine plasma, thereby being reformed into material having lipophobic.

Thereafter, as is the case with the first embodiment, a semiconductor layer 106 is formed in a portion of the surface of the insulating substrate 201, between the bank insulators 105, 105' (FIG. 6D), a gate dielectric film 107 is formed over the top of the semiconductor layer 106 (FIG. 6E), and a gate electrode 108 is formed over the top of the gate dielectric film 107 (FIG. 6F), thereby completing a thin-film transistor. Then, a protective coat (not shown) is formed over insulating substrate 201 so as to cover up the thin-film transistor.

Third Embodiment

Figure 7A:
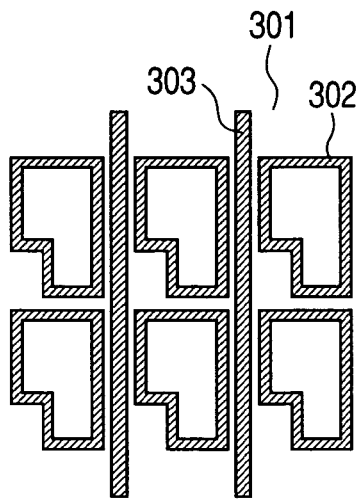
FIG. 7A, FIG. 7B, FIG. 7C, FIG. 7D, FIG. 7E, and FIG. 7F each show respective steps of a process for manufacturing a display device in the case where the thin-film transistor according to the invention is put to use as a thin-film transistor provided in the display device (in each of pixels)
Figure 7B:
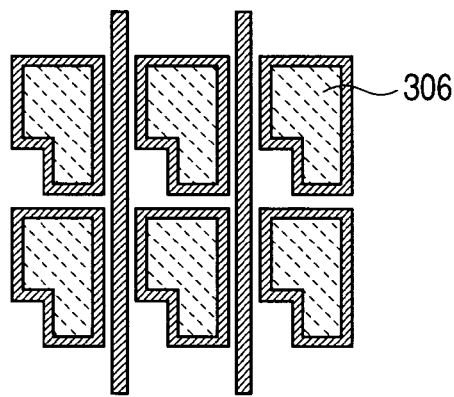
Figure 7C:
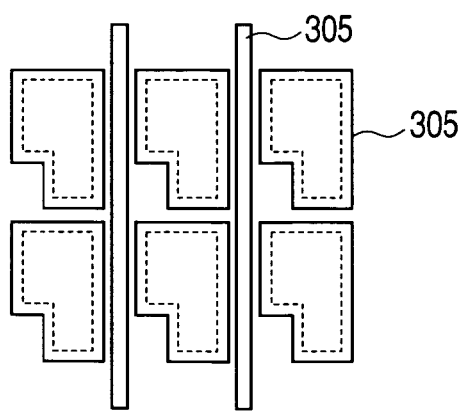

FIGS. 7A to 7C each show respective steps of one embodiment of a process for manufacturing a display device in the case where the thin-film transistor according to the first or second embodiment of invention is put to use as a thin-film transistor formed in respective pixels of the display device In this case, the display device has an insulating substrate on which there are provided gate signal lines extended in the x-direction, to be lined up side by side in the y-direction, and drain signal lines extended in the y-direction, to be lined up side by side in the x-direction. A region surrounded by a pair of the gate signal lines adjacent to each other, and a pair of the drain signal lines adjacent to each other is a pixel region, and the display device is made up such that the pixel region is provided with at least the thin-film transistor which is turned ON by the agency of a signal (scanning signal) from the gate signal line, and a pixel electrode to which a signal (a video signal) from the drain signal line is fed.

The method for manufacturing the display device made up as above is described hereinafter in the order of process steps.

Step 1: FIG. 7A

First, an insulating substrate 301 is prepared. For the insulating substrate 301, use is made of a polycarbonate substrate, for example, 100 μm thick. However, for the insulating substrate 301, use can be made of the substrate shown with reference to the first or second embodiment.

Next, a pattern of, for example, 300 nm in thickness, as shown in FIG. 7A, is drawn on the surface of insulating substrate 301 by a inverse printing method with the use of nano ink of Au, and subsequently, the nano ink was fired at, for example, 150° C.

By so doing, as shown in FIG. 7A, there are formed outer frames 302, each being formed so as to surround the outline of each of the plural pixel electrodes disposed in matrix fashion, and the drain signal lines 303 extended in the y-direction to be lined up side by side in the x-direction, with the outer frames 302 interposed therebetween. The outer frames 302 each have the function of a dike for blocking flow of material for the pixel electrode at the time of forming the pixel electrodes in the subsequent process step. Further, the outer frame 302 is formed in a pattern having a portion away from the drain signal line 303 positioned on a side of the outer frame 302, adjacent to the drain signal line 303 on the left side of the outer frame 302, in the figure. Such a pattern as described is formed in order to secure a thin-film transistor-forming region to be described later on.

In this connection, it is to be pointed out that a method for forming the outer frames 302, and the drain signal lines 303 is not limited to such a method described as above, and the same technique as used in the formation of the source electrode 102, as described with reference to the first embodiment, can be adopted.

Step 2: FIG. 7B

Ag nano ink is applied to an interior of the outer frame 302 by the ink-jet method to be thereby fired at 150° C. As a result, a pixel electrode 306 300 nm thick is formed in the interior of the outer frame 302. In this case, material for the pixel electrode 306 is not limited to Ag, and the pixel electrode 306 can be formed by a method other than the ink-jet method, using ink of metal such as Cu, Au, Ag, Pd, and Pt, ink of a transparent electrically conductive material such as ITO, IZO, and so forth, or an organic electric conductor such as polyaniline, poly 3,4-ethylene dioxythiophene/polystyrene sulfonate, and so forth. Furthermore, the structure of the pixel electrode 306 is not limited to a single-layer structure, and may be a structure where plural layers are stacked on top of each other.

Step 3: FIG. 7C

For example, a polyimide film having positive photosensitivity is spin-coated to a thickness of 1.5 μm on the insulating substrate 301 in such a way as to cover up the outer frames 302, the pixel electrodes 306, and the drain signal lines 303.

The polyimide film is subjected to exposure from the back surface of the insulating substrate 301, by making use of the outer frames 302, the pixel electrodes 306, and the drain signal lines 303 as a photomask, respectively, to be subsequently developed. As a result, bank insulators 305 each substantially matching up in plan view pattern with the outer frames 302, the pixel electrodes 306, and the drain signal lines 303, respectively, is formed on the top thereof.

Thereafter, lipophobic treatment is applied to the surface of each the bank insulators 305 by the same method as is shown with reference to the first embodiment. Further, material for the bank insulator 305 is not limited to the polyimide film, and can be selected out of photosensitive insulators in the wide-ranging scope as is the case with the first embodiment.

Figure 7D:
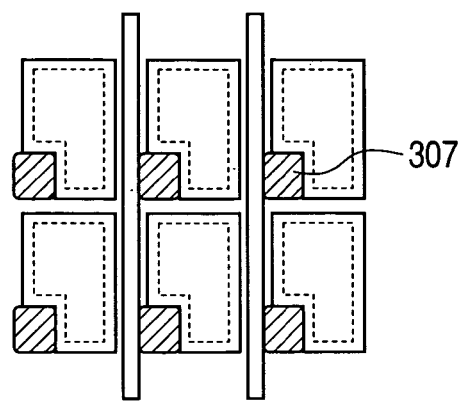

Step 4: FIG. 7D

A semiconductor layer 307 is formed in the thin-film transistor-forming region by use of, for example, a coating method. By so doing, a sidewall face of the semiconductor layer 307, at a part of the periphery thereof, comes to be electrically continuous with the drain signal line 303, and a sidewall face of the semiconductor layer 307, at another part of the periphery thereof, comes to be electrically continuous with the outer frame 302.

Further, a part of the drain signal line 303, connected with the semiconductor layer 307, corresponds to the drain electrode 103 as shown in, for example, the first embodiment, a part of the outer frame 302, connected with the semiconductor layer 307, corresponds to the source electrode 102 as shown in, for example, the first embodiment.

Material of the semiconductor layer 307 is the same as that of the semiconductor layer 106, as shown in the first embodiment.

Figure 7E:
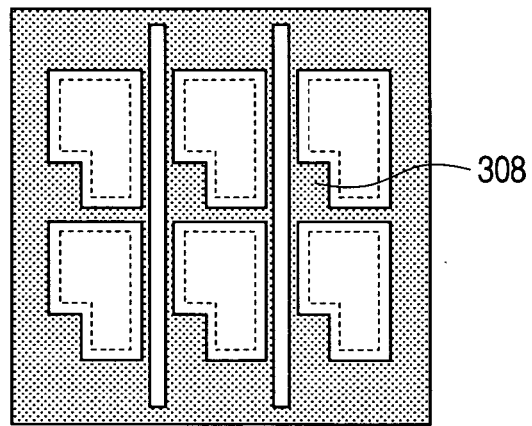

Step 5: FIG. 7E

By use of, for example, the coating method, a gate dielectric film 308 is formed throughout a region where the semiconductor layers 307 are included, and the bank insulators 305 are not formed. Material of the gate dielectric film 308 is the same as that of the gate dielectric film 107 as shown in the first embodiment.

Herein, the gate dielectric film 308 is preferably formed to a thickness larger than that for the drain signal line 303. Because the gate dielectric film 308 comes to have a function of serving as an interlayer dielectric between the drain signal line 303, and a gate signal line 309 to be described later on, this is preferable in order to prevent short circuit from occurring to an intersection between the drain signal line 303, and the gate signal line 309.

Figure 7F:
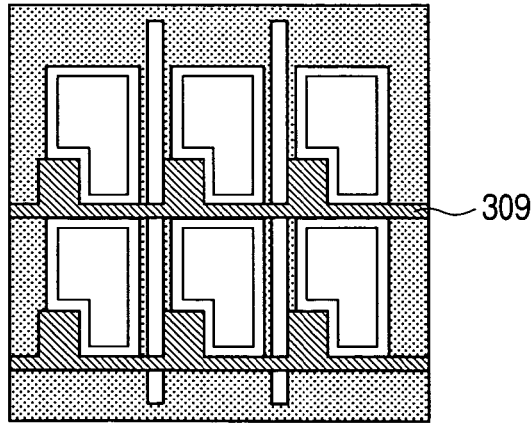

Step 6: FIG. 7F

By use of, for example, the coating method, there are formed the gate signal lines 309 extended in the x-direction in the figure, to be lined up side by side in the y-direction, with the pixel electrodes 306 disposed in matrix fashion, interposed therebetween. In this case, the gate signal line 309 is formed in a pattern where gate electrodes disposed so as to overlap the semiconductor layers 307, respectively, of the respective pixels disposed on the upper side of the gate signal line 309, in the figure, are integrated with the gate signal line 309. Material for the gate signal line 309 is the same as that for the gate electrode 108 shown in the case of the first embodiment.

Thereafter, a polyimide film with a thickness of, for example, 1 μm is formed across the region of the insulating substrate 301 by the screen printing method, thereby forming a protective coat (not shown). In this case, if a driver (display drive circuit) disposed around the insulating substrate 301, and through-holes necessary for interconnection between the respective drain signal lines 303, and the respective gate signal lines 309 are required of the protective coat, they can be formed at the time when the screen printing method is applied.

By going through the respective process steps described as above, it is possible to prevent misalignment in position between respective constituent members even when the printing techniques are used, and further, the display device can be provided with the thin-film transistors with reduced parasitic capacitance.

Fourth Embodiment

Figure 8A:
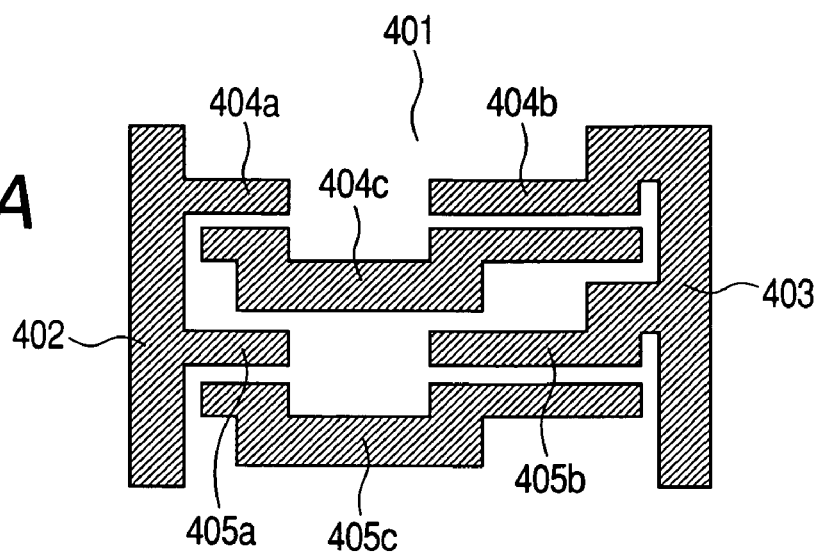
FIG. 8A, FIG. 8B, and FIG. 8C each show respective steps of a process for manufacturing a display device in the case where the thin-film transistors according to the invention is put to use as a thin-film transistor provided in the display device (in a peripheral circuit).
Figure 8B:
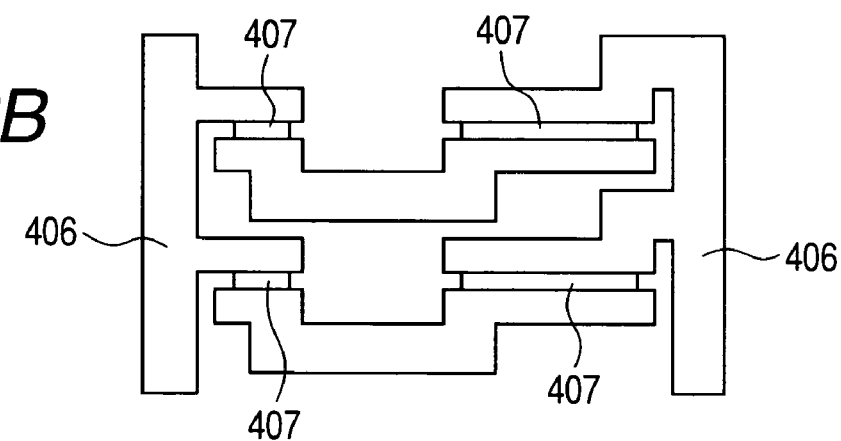
Figure 8C:
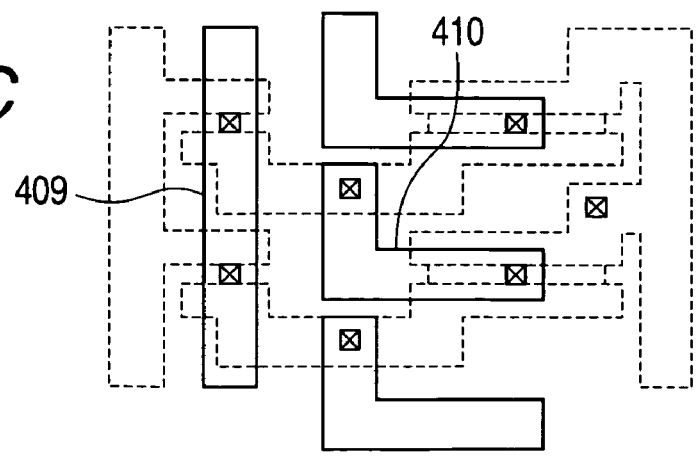

FIGS. 8A to 8C each show respective steps of a process for manufacturing a display device, according to one embodiment of the invention, in the case where the thin-film transistor according to the first or second embodiment is put to use as a thin-film transistor formed in a peripheral circuit of the display device.

In this case, the peripheral circuit of the display device comprises a scanning signal drive circuit for feeding a scanning signal to, for example, the gate signal line (refer to FIG. 7), or a video signal drive circuit for feeding a video signal to the drain signal line (refer to FIG. 7), and those circuits each have, for example, a shift register incorporated therein.

In FIG. 8, there is shown a circuit by way of example, wherein 2 units of series-connected thin-film transistors are formed in 2 stages between a pair of signal interconnects extended in the y-direction in the figure, and lined up side by side in the x-direction, respectively. One embodiment of a method for manufacturing such a circuit is described hereinafter in the order of process steps.

Step 1: FIG. 8A

First, a polycarbonate substrate 100 μm thick is prepared to serve as an insulating substrate 401. Material for the insulating substrate 401 can be selected among insulating materials in a wide-ranging scope, other than polycarbonate, as is the case with the first embodiment.

Next, such a pattern as shown in FIG. 8A, with a thickness of, for example, 300 nm, is drawn on the surface of the insulating substrate 401 by the inverse printing method with the use of nano ink of Au, and subsequently, the nano ink was fired at, for example, 150° C.

In so doing, as shown in FIG. 8A, there are formed a first signal interconnect 402, a second signal interconnect 403, extended in the y-direction in the figure to be lined up side by side in the x-direction, respectively, an electrode 404a on one end side of the 2 units of the series-connected thin-film transistors in a first stage, and an electrode 404b on the other end side thereof, an electrode 404c at a junction of the 2 units of the thin-film transistors, an electrode 405a on one end side of the 2 units of the series-connected thin-film transistors in a second stage, an electrode 405b on the other end side thereof, and an electrode 405c at a junction of the 2 units of the thin-film transistors.

A method for forming the first signal interconnect 402, the second signal interconnect 403, and so forth is not limited to such a forming method described as above, and the same technique as used in the formation of the source electrode 102, as described with reference to the first embodiment, can be adopted.

Step 2: FIG. 8B

Subsequently, a polyimide film having positive photosensitivity is spin-coated to a thickness of 1.5 μm on the insulating substrate 401 to be subsequently subjected to exposure from the back surface of the substrate by making use of the first signal interconnect 402, the second signal interconnect 403, and so forth, as a photomask, respectively, and further, through development of the polyimide film, a bank insulator 406 substantially matching up in a plan view pattern shape with the first signal interconnect 402, the second signal interconnect 403, and so forth, respectively, is formed thereon, respectively. Thereafter, lipophobic treatment is applied to the surface of the bank insulator 406 by the same method as is shown with reference to the first embodiment. Further, the bank insulator 406 is not limited to the polyimide film, and can be selected out of photosensitive insulators in the wide-ranging scope as is the case with the first embodiment.

Next, by use of the coating method, a semiconductor layer 407 is formed between the electrode 404a and the electrode 404c, between the electrode 404b and the electrode 404c, between the electrode 405a and the electrode 405c, and between the electrode 405b and the electrode 405c, respectively.

And by use of the coating method, a gate dielectric film is formed in such a way as to cover at least the semiconductor layers 407, and further, a gate electrode is formed in such a way as to overlap the semiconductor layers 407, respectively, although this is not shown in FIG. 8B. In this case, any of the gate dielectric film, and the gate electrode is formed in regions where the bank insulator 406 has not been formed so as not to cover the surface of the bank insulator 406.

Respective materials used for the semiconductor layer 407, and the gate electrode, and respective methods for forming them are the same as those shown in the first embodiment, however, as to the gate dielectric film, polyvinyl phenol is spin-coated to a thickness of 500 nm to be fired at 150° C., thereby having formed the gate dielectric film throughout a flat surface, except for the bank insulator 406. For the gate dielectric film, use can be made of various materials and various coating methods as is the case with the first embodiment.

Step 3: FIG. 8C

Next, by use of the screen printing method, a polyimide film is formed to a thickness of about 3 μm in the entire region of the surface of the insulating substrate 401 formed as above, thereby forming an interlayer dielectric (not shown). At this point in time, a through-hole is provided at spots of the interlayer dielectric, to be described later on, and those through-holes are formed concurrently with the screen printing method. For the interlayer dielectric, use can be made of an organic film other than the polyimide film, composed of polyvinyl phenol, polyvinyl alcohol, polyamide, parylene, polymethyl methacrylate, poly(vinyl chloride), polyacrylonitrile, poly(perphloroethylene-co-butenylvinyl ether), polyisobutylene, poly(4-methyl-1-penthene), poly (propylene-co-(1-butene)), benzocyclobutene resin, and so forth, respectively, and an inorganic film composed of any of silicon oxide, silicon nitride, and so forth, or a stacked film made up of those films. Further, as for the coating method, use can be made of the spray method and the ink-jet method besides the screen printing method.

Then, a pattern shown in FIG. 8C, with a thickness of, for example, 300 nm, is drawn on the surface of the interlayer dielectric with the use of nano ink of Ag, and subsequently, the nano ink was fired at, for example, 150° C.

By so doing, as shown in FIG. 8C, there are formed a third signal interconnect 409 with which respective gate electrodes of the plural thin-film transistors are connected in common through the through-holes formed in the interlayer dielectric, interconnects 410 with which the electrodes (for example, 404c) at the junctions of the respective thin-film transistors in the first stage, and the gate electrode of the thin-film transistor on one side of the respective thin-film transistors in the second stage are connected in common through the through-holes formed in the interlayer dielectric, and so forth.

In this connection, there is no particular limitation to the material for the third signal interconnect 409, and the interconnects 410, respectively, as long as it is an electric conductor, and it may be drawn with the use of nano ink of any of, for example, Au, Cu, Pt, Pb, and so forth, or an organic electric conductor such as polyaniline, poly 3,4-ethylene dioxythiophene/polystyrene sulfonate, and so forth. Techniques for us in drawing the third signal interconnect 409, and the interconnects 410 include the screen printing method, the inverse printing method, the hot stamping method, the microprinting method, and so forth, besides the ink-jet method. Furthermore, the third signal interconnect 409, and the interconnects 410 can be formed by the known method such as the plasma enhanced CVD) method, thermal vapor deposition method, sputtering method, electrolytic polymerization method, electroless plating method, electroplating method, and so forth with the use of a metal selected from the group consisting of Al, Cu, Ti, Cr, Au, Ag, Ni, Pd, Pt, and Ta. The electrodes of the respective the thin-film transistors described as above can be used not only in the form of a single-layer structure but also in the form of a structure where plural layers are stacked. Further, the electrodes of the respective the thin-film transistors described as above can be worked into a desired shape by use of the photolithography, shadow mask method, laser ablation method, and so forth. In drawing the interconnects for the respective thin-film transistors described as above, a bank insulator is not used, so that the interconnects each are rendered larger in width than each of other interconnects in consideration of a margin of safety, however, since the interlayer dielectric has the thickness as large as 3 μn, it has been possible to check parasitic capacitance occurring between the third signal interconnect 409, and other electrodes/interconnects, and parasitic capacitance occurring between each the interconnects 410, and the other electrodes/interconnects, to a minimum.

Thereafter, a polyimide film 1 μm thick is formed by the screen printing method, thereby forming a protective coat (not shown). The through-holes for junctions with respective terminals can be formed at the time when the screen printing method is applied.

By going through the respective process steps described as above, it is possible to prevent misalignment in position between respective constituent members even when the printing techniques are used and further, to develop a circuit with reduced parasitic capacitance. Such a circuit can be used in an ID-tag device, and so forth.

Further, the thin-film transistor according to the first embodiment can be put to use as a thin-film transistor in, for example, a sensor.

Further, with the present embodiment, there has been shown a case where a transparent substrate has been in use by way of example, however, an opaque substrate can be used by the same process as adopted in the second embodiment.

What is claimed is:

1. An electronic device having a thin-film transistor, the thin-film transistor comprising:
    an insulating substrate;
    a source electrode, and a drain electrode, disposed over the top of the insulating substrate;
    a semiconductor layer electrically continuous with the source electrode, and the drain electrode, respectively;
    a gate dielectric film formed over the top of at least the semiconductor layer; and
    a gate electrode disposed over the top of the gate dielectric film so as to overlap the semiconductor layer, wherein a first bank insulator is formed so as to overlie the source electrode, a second bank insulator is formed so as to overlie the drain electrode, and the semiconductor layer, the gate dielectric film, and the gate electrode are embedded in a region between the first bank insulator, and the second bank insulator;
    wherein the first and second bank insulators are formed to have a plurality of sidewall faces which have inverse taper shapes against the insulating substrate, and the semiconductor layer is formed such that respective sidewall faces thereof are butted against a sidewall face of the source electrode, and a sidewall face of the drain electrode, while overlying the source electrode, and the drain electrode.

2. An electronic device according to claim 1, wherein the semiconductor layer, the gate dielectric film, and the gate electrode are formed by a coating method.

3. An electronic device according to claim 1, wherein the bank insulators each are lipophobic.

4. An electronic device according to claim 1, wherein the gate electrode is formed such that the surface thereof is lower than the surface of each the bank insulators over the insulating substrate.

* * * * *